(12) United States Patent
Kothari et al.

(10) Patent No.: US 6,552,324 B1
(45) Date of Patent: Apr. 22, 2003

(54) SELECTABLE PIXEL AMPLIFIER FOR USE IN A PHOTOSENSOR ARRAY

(75) Inventors: Pravin N. Kothari, Poughkeepsie, NY (US); Paul A. Hosier, Rochester, NY (US); Scott L. Tewinkle, Ontario, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/215,809

(22) Filed: Dec. 18, 1998

(51) Int. Cl.[7] .............. H01J 40/14; H03F 3/08
(52) U.S. Cl. .............. 250/214 A; 250/208.1; 330/296; 330/277; 348/300
(58) Field of Search .......... 250/208.1, 214 A; 330/277, 290, 296, 307, 310; 348/300, 301, 306, 307, 308

(56) References Cited

U.S. PATENT DOCUMENTS

| | | | |
|---|---|---|---|
| 4,857,476 A | 8/1989 | Colinge ............... 437/33 |
| 4,958,133 A | 9/1990 | Bazes ............... 330/253 |
| 5,493,423 A | 2/1996 | Hosier ............... 358/482 |
| 6,014,061 A | * | 1/2000 | Tachigori ............... 330/308 |
| 6,100,764 A | * | 8/2000 | Kim ............... 250/241 A |
| 6,147,556 A | * | 11/2000 | Nakano ............... 330/277 |

OTHER PUBLICATIONS

Bazes, "Two Novel Fully Complementary Self–Biased CMOS Differential Amplifiers", IEEE Journal of Solid–State Circuits, vol. 26, No. 2, Feb. 1991, pp. 165–168.

* cited by examiner

Primary Examiner—Stephone B. Allen
(74) Attorney, Agent, or Firm—R. Hutter

(57) ABSTRACT

A CMOS-based voltage signal amplifier is particularly useful for amplifying signals from a single photodiode, or a small set of photodiodes, within a large photosensitive imaging device. When the imaging device reads out image signals from a large number of photodiodes, each amplifier is selected for operation only within a very brief time window when the particular photodiode associated therewith is reading out. The amplifier of the present design is suitable for rapid power-up and power-down when it is selected and deselected.

9 Claims, 3 Drawing Sheets

SELECTABLE PIXEL AMPLIFIER FOR USE IN A PHOTOSENSOR ARRAY

The following U.S. patent is hereby incorporated by reference: U.S. Pat. No. 5,493,423, "Resettable Pixel Amplifier for an Image Sensor Array", assigned to the Assignee hereof.

FIELD OF THE INVENTION

The present invention relates to an image sensor array, such as found, for example, in digital scanners, copiers, and facsimile machines. More particularly, the present invention relates to a selectable amplifier which can be associated with at least one individual photosensor in such a sensor array.

BACKGROUND OF THE INVENTION

Image sensor arrays typically comprise a linear array of photosensors which scan an image-bearing document and convert the microscopic image areas viewed by each photosensor to image signal charges. Following an integration time, the image signal charges are amplified and transferred to a common output line or bus through successively actuated multiplexing transistors.

In the scanning process, bias and reset charges are applied to each photosensor (such as a photodiode) in a predetermined time sequence during each scan cycle. In a particular embodiment of such an image sensor array, a two-stage transfer circuit is provided for transferring the image signal charges from the photodiodes. A bias charge is applied to each photodiode through a bias charge injection transistor coupled to a node between the photodiode and the input to the transfer circuit. From the transfer circuit, the image-based charges are caused to pass through an amplifier circuit, one amplifier circuit being typically provided for each photodiode, or at least to each RGB-color triplet of color-sensitive photodiodes.

During a readout of the image signals along an array of photodiodes, it is desirable that the individual amplifiers associated with each photodiode be activated only long enough to amplify the image signal being read out from a particular single photodiode; when the particular photodiode is not reading out its image based charge at the moment, it is desirable that the associated amplifier be powered down temporarily. This power-down is desirable from the perspective of lowering the total power requirements of a silicon chip which may have several hundred photodiodes and associated amplifiers thereon, as well as for other reasons.

The present invention is thus directed to a design of an individually-selectable amplifier which can be associated with a single photodiode or other photosensor in an image sensor array.

DESCRIPTION OF THE PRIOR ART

Bazes, "Two Novel Fully Complementary Self-Biased CMOS Differential Amplifiers," *IEEE Journal of Solid-State Circuits*, Vol. 26, No. 2, Feb. 1991, pp. 165–168, discloses designs of differential amplifiers having fully complementary configurations and which are self-biased through negative feedback. U.S. Pat. Nos. 4,857,476 and 4,958,133 by the same author show related amplifier designs.

U.S. Pat. No. 5,493,423, incorporated by reference above, discloses an amplifier circuit which can be associated with an individual photosensor in an image sensor array. With each cycle of passing an image signal through an amplifier, a low standby current is applied to certain transistors within the amplifier until the next signal is to be output. Critical nodes within the amplifier are caused to settle to known charge-values before each image signal is passed therethrough.

SUMMARY OF THE INVENTION

According to one aspect of the present invention, there is provided an amplifier suitable for processing image signals. An input stage includes a first differential pair including two p-devices and a second differential pair, complementary to the first differential pair, including two n-devices. A first load device supplies current to the first differential pair and a second load device supplies current to the second differential pair, the first load device and the second load device being biased at a common bias node. Self-biasing circuitry generates a bias at the bias node. Means are provided for deselecting the amplifier in response to an external signal, the deselecting means including means for grounding the bias node and means for eliminating current in the self-biasing circuitry in response to the external signal.

According to another aspect of the present invention, there is provided a photosensitive apparatus, comprising a set of photosensors, each photosensor outputting a voltage signal relating to an intensity of light thereon; a set of amplifiers, each amplifier in the set of amplifiers being associated with a photosensor in the set of photosensors, for amplifying a voltage signal from the photosensor; and means for sending a deselection signal to any amplifier. Each amplifier includes an input stage, the input stage having a first differential pair including two p-devices and a second differential pair, complementary to the first differential pair, including two n-devices. A first load device supplies current to the first differential pair and a second load device supplies current to the second differential pair, the first load device and the second load device being biased at a common bias node. Self-biasing circuitry generates a bias at the bias node. Means are provided for deselecting the amplifier in response to the deselection signal, the deselecting means including means for grounding the bias node and means for eliminating current in the self-biasing circuitry in response to the deselection signal.

DETAILED DESCRIPTION OF THE INVENTION

Figure 1:
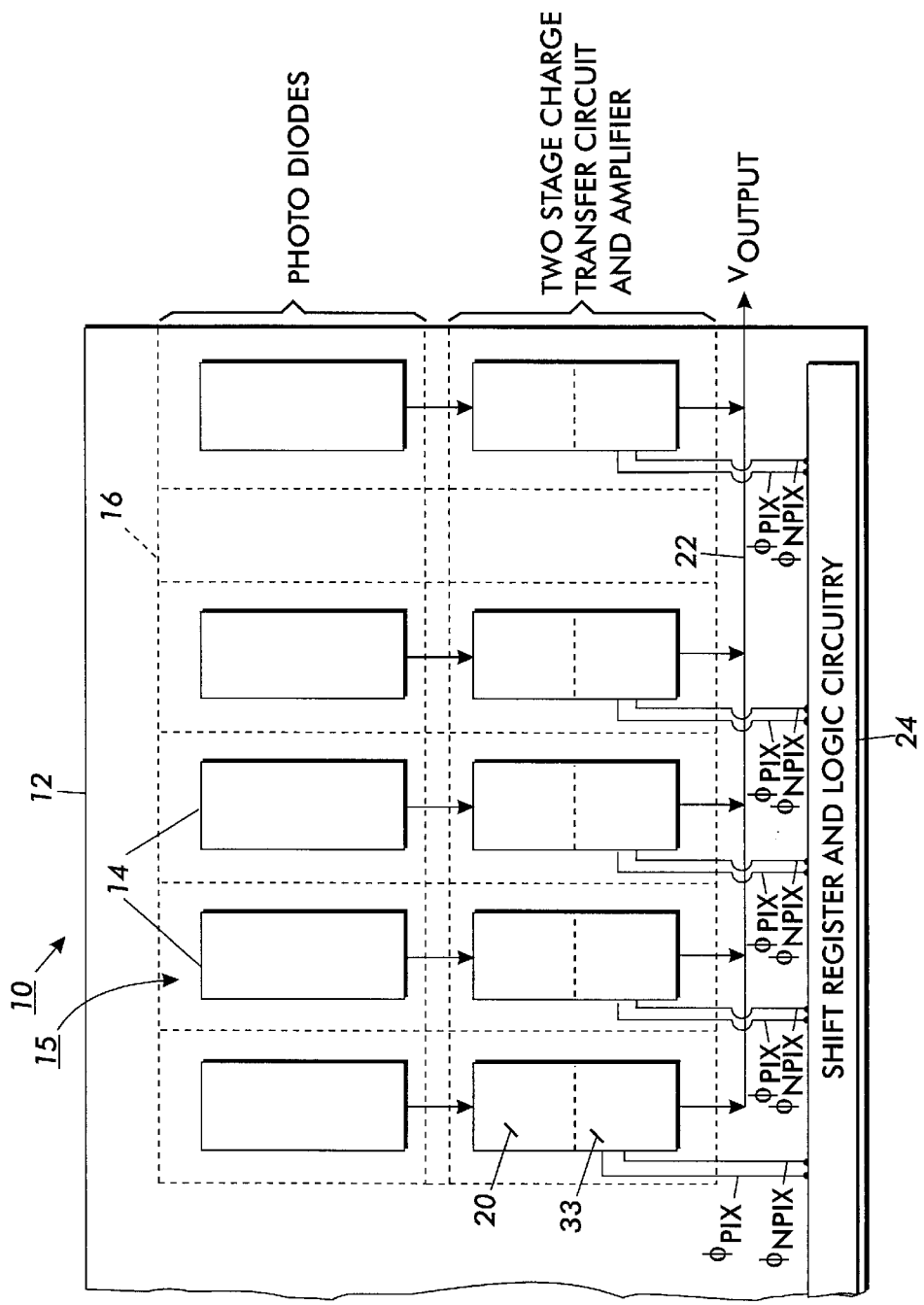
FIG. 1 is a schematic view of am image scanning array having an array of photosensor cells, each cell having a photodiode with two-stage transfer circuit and amplifier for transferring image signal charges from the photodiodes to a common output bus.

Referring to FIG. 1, there is shown the image sensor array with two stage transfer, designated generally by the numeral 10, of the type to which the present invention is directed. Image sensor array 10 includes a chip 12 of silicon with a plurality of photosites in the form of photodiodes 14 thereon. Photodiodes 14 are in closely spaced juxtaposition with one another on chip 12 in a linear array or row 16. Several smaller arrays such as array 10 can be abutted together end to end with one another to form a longer array, i.e., a full width or contact array, with spacing between the photodiodes inside the chip thereby maintaining photodiode pitch across the entire full width of the composite array.

While photodiodes 14 are shown and described herein, other photosite types such as amorphous silicon or transparent electrode MOS type photosites may be envisioned. Further, while a one dimensional sensor array having a single row 16 of photodiodes 14 is shown and described herein, a two dimensional sensor array with plural rows of photodiodes may be contemplated.

Each photodiode 14 has a two stage transfer circuit 20 associated therewith which together with the photodiode and an amplifier 33 form a photosite cell 15 at the array front end. In each cell 15, the image signal charge from the photodiode 14 is amplified to bring the image signal charge to a desired potential level prior to transferring the charge to a common video output line or bus 22. Suitable shift register and logic circuitry 24 provides timing control signals ΦPIX (with an optional complement, ΦPIX) for connecting each pixel cell 15 to bus 22 in the proper timed sequence; a shift register such as 24 typically includes a set of stages therein, each stage in this embodiment being associated with one photosite cell 15, and thus associated with one amplifier, as can be seen as the set of ΦPIX and ΦPIX lines emerging from shift register 24.

Image sensor array 10 may for example be used to raster scan a document original, and in that application, the document original and sensor array 10 are moved or stepped relative to one another in a direction (i.e., the slow scan direction) that is normally perpendicular to the linear axis of array 10. At the same time, the array scans the document original line by line in the direction (i.e., the fast scan direction) parallel to the linear axis of the tray. The image line being scanned is illuminated and focused onto the photodiodes 14. During an integration period, a charge is developed to each photodiode proportional to the reflectance of the image area viewed by each photodiode. The image signal charges are thereafter transferred by two stage transfer circuits 20 via amplifier 33 to output bus 22 in a predetermined step by step timed sequence.

Figure 2:
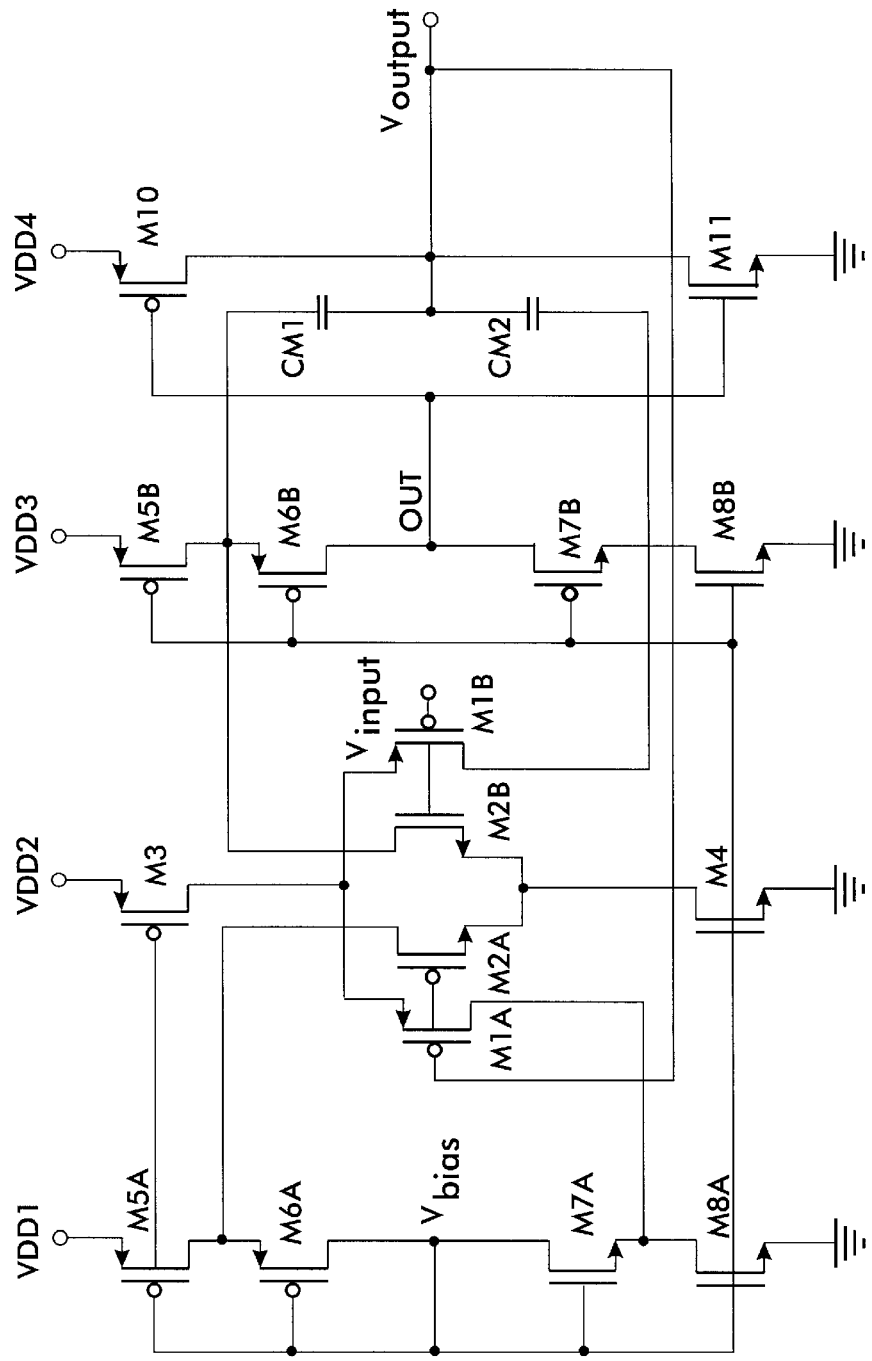
FIG. 2 is a schematic diagram of a basic, non-selectable amplifier circuit, as could be used in the sensor array of FIG. 1.

FIG. 2 is a schematic view of a design of amplifier which could be used as amplifier 33 in the context of the image sensor array of FIG. 1. The amplifier shown in FIG. 2 is conceptually similar to the "very-wide-common-mode-range differential amplifier," or VCDA, described in the article by Bazes referenced above. Both the FIG. 2 amplifier and the Bazes design represent a CMOS differential amplifier with wide input dynamic range, which is fully complementary and entirely self-biased. Both designs ultimately derive from a combination of two "folded-cascode" differential amplifiers, each the complement of the other, as described in Bazes. The design shown in FIG. 2 is particularly useful for providing a desirably linear unity-gain amplification from zero to VDD (full power supply range).

In overview, the basic amplifier of FIG. 2 functions as follows. The is amplifier, generally indicated as 33, accepts an image-based voltage signal $V_{input}$ and outputs a voltage signal $V_{output}$. There is provided, at $V_{input}$, a differential pair of p-devices M1A and M1B. The differential pair of p-devices M1A and M1B are combined as shown with a differential pair of n-devices, M2A and M2B. The p-devices M1A and M1B share a common current source, VDD2, while the emitters of the n-differential pair M2A and M2B share a common ground actuable through transistor M4. The n-differential pair M2A and M2B is useful for providing an output $V_{output}$ in the range of 2–5 volts, while the p-differential pair M1A, M1B is useful for outputting voltages in the range of 0–3 volts. With reference to the claims here inbelow, the set of complementary CMOS transistor pairs M1A, M1B, M2A, and M2B forms a folded cascode amplifier in itself and represent the "input stage" for the overall amplifier 33. The illustrated arrangement has a larger drain-source voltage drop on the input pairs, and thus has greater dynamic range, than ordinary single transistor pair differential amplifiers.

Voltage sources VDD1 and VDD3 form balanced rails providing summing current to the two kinds of differential pairs, while the transistors M10 and M11 proximate to voltage source VDD4 form a push-pull output driver stage. (The various voltage sources in the schematic, VDD1–VDD4 are in fact all the same voltage source, but are differently-numbered for reference purposes.) The line connecting $V_{output}$ to the gate of device M1A & M2A forms the feedback loop which causes the amplifier 33 to be a unity-gain amplifier.

As the input voltage $V_{input}$ rises from a low to high voltage, the p-type input devices M1A, M1B switch from full conduction to no conduction and the n-type devices M2A, M2B switch from no conduction to full conduction currents. In other words, the n-channel devices are inactive in the region near ground and the p-channel devices are inactive in the region near VDD. Between these extremes, both pairs are active. In the region where both pairs are on, the transconductance of the input stage is twice as big as in the regions where only one pair (of n-devices or p-devices) is on. The transconductance is proportional to the square root of the saturation drain current of the device. This makes optimal frequency compensation very difficult, because the gain-bandwidth product of an amplifier is proportional to the transconductance of its input stage.

The bias current to the pairs of devices M1A, M1B and M2A and M2B in the input stage is supplied by load devices M3 and M4. The currents through load devices M3 and M4 must be identical; any differences in currents through M3 and M4 devices would result in extreme shifts in amplifier-bias voltages. Therefore, external biasing of load device M3 for the p-channel pair and load device M4 for the n-channel pair is not desirable. The self-biasing scheme is created by connecting both M3 and M4 to a single internal bias node, indicated as $V_{bias}$ in FIG. 2. The self-biasing of the amplifier creates a negative-feedback loop that stabilizes the bias voltages for M3 and M4.

The current paths are formed by M3, M1A, and M8A or M3, M1B, and M8B for the p-devices, and are formed by M5A, M2A, and M4 or M5B, M2B and M4 for the n-devices. Precise balancing of currents through the two paths is dependent on the ratios of the devices M6A to M7A (and M6B to M7B) as well as M5A to M8A (M5B to M8B). The cascode stage formed by devices M5A, M6A, M7A, and M8A on the biasing side, and the cascode stage formed by devices M5B, M6B, M7B, and M8B on the output side are identical and complementary to each other. Each cascode stage forms a summing circuit for the currents through transistors M1A and M2A (or M1B and M2B) of the input stage. With particular reference to the claims herein below, the cascode stage, formed by M5A–M8A represents the "self-biasing circuitry" for the self-biasing amplifier, and generate the bias on $V_{bias}$. Voltage developed at the node $V_{bias}$ is the self-biasing voltage needed to provide the balancing of currents through the input stage.

The cascode stage formed by M5B through M8B drives the output buffering stage. The output stage is formed by two common-source output transistors M10 and M11. In order to provide a stable operation, capacitors CM1 and CM2 are used for frequency compensation. The output is fed back to the inputs of devices M1A and M2A of the differential amplifier. The input signal is connected to the gates of M1B and M2B as shown in FIG. 2. The differential amplifier output is in phase with the input signal.

The load devices M3 and M4 are biased by node $V_{bias}$, and therefore quiescent current in the input stage is always present. The quiescent power consumption by the circuit must be switched off in an application where one or more of these in an array of amplifiers are selected at a time and the others are in deselected mode or powered down. In order to eliminate the current within the amplifier 33 when the amplifier 33 is in a deselected mode, the biasing node $V_{bias}$ needs to be grounded. Returning to FIG. 1, it is most desirable, from the standpoint of overall power consumption of the image sensor array 10 that individual amplifiers 33 be powered up for operation only in the narrow window of time during each readout in which the particular photodiode 14 associated with a single amplifier is transferring a signal therethrough. If a typical sensor array 10 on a single chip 12 includes approximately 250 photodiodes 14, it will be evident that the overall duty cycle of any individual amplifier 33 will be quite short in proportion to the total time of operation of the image sensor array 10. It is thus desirable to provide an amplifier design which preserves all of the desirable characteristics of, for example, the amplifier of FIG. 2, but which also is especially suitable for rapid power-up and power-down in the context of an image sensor array.

Figure 3:
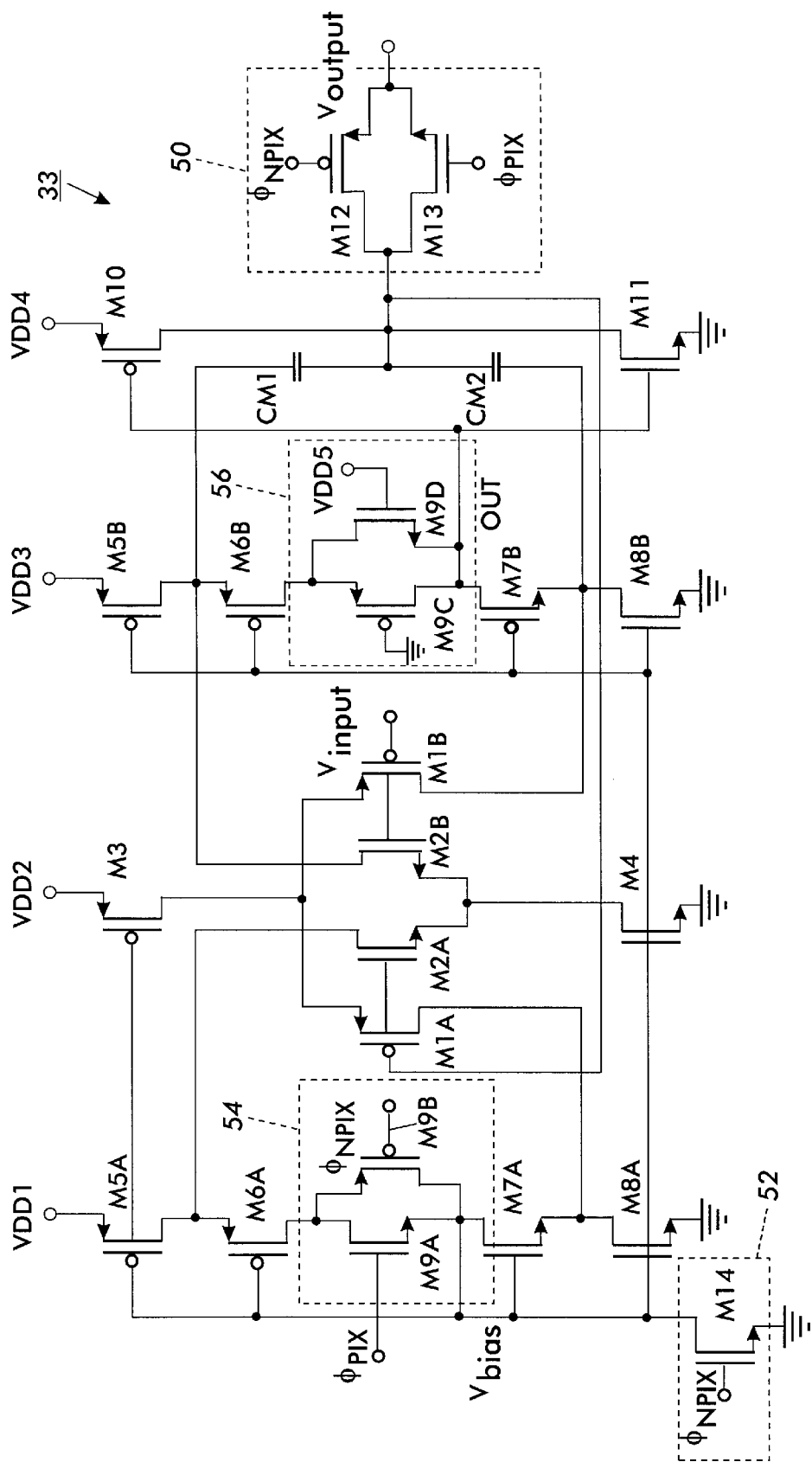
FIG. 3 is a schematic diagram of an amplifier circuit according to the present invention.

FIG. 3 is a schematic showing a preferred design of an amplifier incorporating the present invention. Comparing FIG. 2 to FIG. 3, it will be noted that the FIG. 3 schematic includes all of the elements of the FIG. 2 schematic, but in addition includes certain inputs which relate to whether the amplifier 33 is being selected at a particular moment. (The areas of difference between FIG. 2 and FIG. 3 are indicated by the dotted-line boxes in FIG. 3.) It will be noted that the FIG. 3 amplifier includes, in addition to the original inputs and outputs $V_{input}$ and $V_{output}$, inputs for selecting the amplifier 33 as a whole: as shown in FIG. 3, there are inputs ΦPIX and ΦPIX which are complements of each other. The inputs ΦPIX and ΦPIX are readily derived from the standard suitable shift register and logic circuitry 24 such as shown in FIG. 1.

It will be noted, in comparing FIG. 2 to FIG. 3, that when an input ΦPIX is high, the schematic of FIG. 3 is identical to the circuit of FIG. 2: when ΦPIX is high, the amplifier 33 is "selected" and operates as an amplifier. Significantly, when ΦPIX is low, and by definition when ΦPIX is high, the amplifier 33 is powered down.

Looking at the different areas in which a high value of ΦPIX (a "deselect" signal) affects the circuit of FIG. 3, it will first be noted that a high ΦPIX will disconnect the output from any downstream circuitry, as shown at area 50. A high value of ΦPIX will also create a channel in transistor M14, which has the effect of shutting off all the n-devices M8A, M4, M8B (area 52). The activation of ΦPIX at area 54 effectively removes any path between the n- and p-devices within the amplifier 33. Another portion of the schematic of FIG. 3 which differs from FIG. 2, area 56, has an additional VDD input, VDD5, which causes the amplifier 33 to match the impedance of a new signal when the amplifier 33 is next selected.

The purpose of the additional inputs for deselecting and reselecting the amplifier 33 is to eliminate the current from the amplifier 33 when the amplifier 33 is in a deselected mode. To accomplish this effectively, two things must happen: (1) the biasing node $V_{bias}$ needs to be grounded, and (2) the current in the self-biasing portion of the amplifier must have any residual current therein eliminated.

At deselection of amplifier 33, the biasing node $V_{bias}$ is grounded as follows. The pair of devices in area 54, devices M9A and M9B, form a switch with two out of phase control clocks. Similarly, devices M9C and M9D at area 56 form a switch biased as shown to allow the current to flow through in each direction. The gates of devices M9D and M9C are connected to VDD3 and ground, respectively, so that they are conducting at all times. When the amplifier 33 is deselected, devices M9A and M9B in area 54 are turned off, and device M14 in area 52 is turned on by the clocks ΦPIX and ΦPIX. This operation pulls down the $V_{bias}$ node to ground and shuts off all n-type devices of the input stage and the output buffer stage, and therefore no current is being drawn by the circuit. The only current drawn is the leakage current through the various n-devices and the CM1, CM2 capacitors.

Further, as mentioned above, to deselect an amplifier 33 properly, the self-biasing circuitry must have all current eliminated therefrom. In the FIG. 3 embodiment, the self-biasing circuitry, which ultimately generates the bias on $V_{bias}$, is represented by the cascode stages formed by transistors M5A–M8A and M5B–M8B. Current is eliminated in these stages by activation of transistor M14 in area 52 by a high signal ΦPIX on the base thereon. This action, as shown, shuts off all n-devices M7A, M8A, M7B, M8B in the cascode stages, and causes any current in transistors M5A–M8A and M5B–M8B to be grounded out. In this context the actions of transistors M9A–M9D are added for range and symmetry reasons: when the amplifier 33 is active or selected, device M14 in area 52 is turned off and devices M9A and M9B are turned on by their control clocks, allowing the bias to rise to the necessary DC bias level for devices M3 and M4; input signal $V_{input}$ can then be observed at the output of the amplifier.

In the FIG. 3 embodiment, the same complementary clock signals are shown controlling both switches M9A, M9B and M12, M13. However each switch could be controlled by a separate pair of clock signals. Device M9B can be removed from the circuit if the linearity of the amplifier transfer characteristic is acceptable. The clocks used for driving M9A and M14 must be of opposite polarity or be generated by any two non-overlapping clocks.

While the invention has been described in detail with reference to specific and preferred embodiments, it will be appreciated that various modifications and variations will be apparent. All such modifications and embodiments as may occur to one skilled in the art are intended to be within the scope of the appended claims.

What is claimed is:

1. An amplifier suitable for processing image signals, comprising:

an input stage having a first differential pair including two p-devices and a second differential pair, complementary to the first differential pair, including two n-devices;

a first load device for supplying current to the first differential pair and a second load device for supplying current to the second differential pair, the first load device and the second load device being biased at a common bias node;

self-biasing circuitry for generating a bias at the bias node; and means for deselecting the amplifier in response to an external signal, the deselecting means including means for grounding the bias node and means for eliminating current in the self-biasing circuitry in response to the external signal.

2. The amplifier of claim 1, wherein the self-biasing circuitry includes two complementary cascode stages associated with the bias node.

3. The amplifier of claim 2, wherein the means for eliminating the current in the self-biasing circuitry includes means for shutting off an n-device in each cascode stage.

4. The amplifier of claim 1, the deselecting means including means for disconnecting the amplifier from downstream circuitry.

5. A photosensitive apparatus, comprising:
   a set of photosensors, each photosensor outputting a voltage signal relating to an intensity of light thereon;
   a set of amplifiers, each amplifier in the set of amplifiers being associated with a photosensor in the set of photosensors, for amplifying a voltage signal from the photosensor; and
   means for sending a deselection signal to any amplifier;
   each amplifier including
      an input stage having a first differential pair including two p-devices and a second differential pair, complementary to the first differential pair, including two n-devices;
      a first load device for supplying current to the first differential pair and a second load device for supplying current to the second differential pair, the first load device and the second load device being biased at a common bias node;
      self-biasing circuitry for generating a bias at the bias node; and
      means for deselecting the amplifier in response to the deselection signal, the deselecting means including means for grounding the bias node and means for eliminating current in the self-biasing circuitry in response to the deselection signal.

6. The apparatus of claim 5, wherein the self-biasing circuitry includes two complementary cascode stages associated with the bias node.

7. The apparatus of claim 6, wherein the means for eliminating the current in the self-biasing circuitry includes means for shutting off an n-device in each cascode stage.

8. The apparatus of claim 5, the deselecting means including means for disconnecting an amplifier from downstream circuitry.

9. The apparatus of claim 5, the means for sending a deselection signal to any amplifier including a shift register having set of stages, each stage being associated with an amplifier.

* * * * *